(12) United States Patent
Itkin

(10) Patent No.: US 7,522,077 B1
(45) Date of Patent: Apr. 21, 2009

(54) METHOD AND APPARATUS FOR TESTING DATA CONVERTERS

(75) Inventor: Yuval Itkin, Zoran (IL)

(73) Assignee: DSP Group Limited, Herzelia (IL)

( * ) Notice: Subject to any disclaimer, the term of this patent is extended or adjusted under 35 U.S.C. 154(b) by 0 days.

(21) Appl. No.: 12/015,179

(22) Filed: Jan. 16, 2008

(51) Int. Cl.
*H03M 1/10* (2006.01)
(52) U.S. Cl. .................................. 341/120; 341/118
(58) Field of Classification Search .............. 341/120, 341/118, 155, 144, 110
See application file for complete search history.

*Primary Examiner*—Rexford Barnie
*Assistant Examiner*—Joseph Lauture

(57) ABSTRACT

An apparatus and method for testing a unit comprising of digital-to-analog converter and an analog-to-digital converter, by determining offset and gain-difference between the two converters, and then testing the pair using a wide range of values. During the testing, the gain-control is injected into the unit in order to set the unit size of one of the converters, and the offset is subtracted from the output signal of the unit, so that the transfer functions of the converters are matched. The gain-control is optionally determined using the successive approximation algorithm.

10 Claims, 6 Drawing Sheets

METHOD AND APPARATUS FOR TESTING DATA CONVERTERS

BACKGROUND OF THE DISCLOSURE

1. Technical Field

The present disclosure relates to testing in general, and to a method and apparatus for digitally testing a pair of converters, in particular.

2. Discussion of the Related Art

When conducting tests of an electronic device, testing should be performed to the level of a replaceable component, i.e., if a particular component comprises two or more sub-components which are not individually fixed or replaced, it is enough to test the component as one unit, and there is no particular importance to pinning down the malfunctioning sub-component. Since testing should be performed as cheap and efficient as possible, then testing such a component as one unit, if designed correctly may save specialized equipment and separate tests and thus increase the testing efficiency.

When testing a combined converter unit comprising a Digital-to-Analog Converter (DAC) and an Analog-to-Digital Converter (ADC), if the two converters are not to be replaced or fixed separately, it is beneficial to test them together, by feeding digital data into the DAC, feeding the analog output of the DAC into the ADC, and digitally testing the digital output of the ADC. Using this scheme, it is not required to generate or test analog signals, thus saving on analog testing equipment and on testing time.

However, when testing the two converters together, even if both are functional, their characteristics indicating the output voltage vs. the input voltage may not be one-to-one, and moreover may not match each other. Thus, the output of such a unit comprising a pair of converters may deviate from the input although both components are functional.

Consider for example FIG. 1, showing a graphical representation of two non-matching converters, in which horizontal axe 104 indicates the digital values, and vertical axe 108 indicates the analog values. Line 112 represents the transfer function of one converter, and line 116 represents the reverse transfer function of the other converter. Although both lines are shown on the same coordinate system it will be appreciated by person skilled in the art that for one converter axe 104 represents the input and axe 108 represents the output, and vice versa for the other converter. Since the two lines do not coincide, then there is an offset-value 120 and a gain-difference 124 between them. Once offset 120 and gain-difference 124 are known, they can be compensated for and the unit comprising the two converters can then be tested.

There is thus a need for a method and apparatus for detecting the offset and gain between a converter pair consisting of connected digital-to-analog converter DAC and an analog-to-digital converter, so that the unit as a whole can be tested for proper functionality, using digital equipment only.

SUMMARY OF THE DISCLOSURE

A method and apparatus for testing a converter unit comprising a digital-to-analog converter and an analog-to-digital converter, without using analog testing equipment. An offset value and gain difference are determined for the two converters, the gain difference is fed to the digital-to-analog converter so as to enable digital control over the analog amplification of the unit.

In accordance with a preferred embodiment, there is thus provided a method for testing a unit comprising a first converter converting from digital to analog signals and a second converter converting from analog to digital signals, the method comprising: a calibration stage, the calibration stage comprising: an offset determination step for determining an offset between the first converter and the second converter; and a gain-difference determination step for determining a gain-control value differentiating between the first converter and the second converter; and a testing stage for testing the unit, wherein during the testing stage, the gain-control value is injected into the unit, and is used for changing the output of one of the first converter or the second converter, and wherein the offset is subtracted from the output of the second converter. Within the method, during the testing stage, a difference between a specific input value injected into the unit and an output value of the unit is optionally compared against a first threshold. Within the method, during the testing stage, an integrated difference between an input signal injected into the unit and a signal output by the unit is optionally compared against a second threshold. Within the method, the gain-difference determination step optionally uses successive approximation. Within the method, optionally the gain-difference value determined at each iteration of the successive approximation is used during later iterations. Optionally, the successive approximation determines a higher order bit of the gain value prior to determining a lower order bit. The method optionally comprises a step of sending a synchronization signal so as to adjust sampling an input signal injected into the unit with sampling an output signal output by the unit.

Another aspect of the disclosure relates to a testing apparatus for testing a unit having a unit amplification, the testing apparatus comprising a first converter converting from digital to analog signals and a second converter converting from analog to digital signals, the testing apparatus comprising: a signal generator for generating input signal to be injected into the unit; a test analyzer for comparing the input signal to an output signal output from the unit and determining an offset value and a gain-control value between the first converter and the second converter; and a test controller for controlling an offset value and test value determination stage and full testing stage, wherein after the offset value and the gain-control value are determined, the gain-control value is input into the unit, so as to enable digital control of the unit amplification. Within the apparatus, a synchronization signal is optionally sent from the signal generator to the test analyzer for matching a processing delay between the output signal and the input signal. Within the apparatus, the controller optionally controls test level durations so as to allow for a sampling rate higher for the output signal than for the input signal.

BRIEF DESCRIPTION OF THE DRAWINGS

Exemplary non-limited embodiments of the disclosed subject matter will be described, with reference to the following description of the embodiments, in conjunction with the figures. The figures are generally not shown to scale and any sizes are only meant to be exemplary and not necessarily limiting. Corresponding or like elements are designated by the same numerals or letters.

FIG. 1 is a schematic illustration of transfer functions of a DAC and ADC having an offset and a gain there between;

DETAILED DESCRIPTION OF THE PREFERRED EMBODIMENT

In preferred embodiments of the disclosure, a testing environment is provided for testing a unit comprising a pair of DAC and an ADC. Testing comprises two main stages, a calibration stage in which the offset-value and the gain difference are determined, and a full testing stage at which the offset value and the gain difference are used when testing the unit with a wide voltage range. During calibration stage, the offset is determined first. A triangular symmetric wave is injected into the unit, preferably ranging between 0x100 and 0x300, with duration of a predetermined number of clock cycles for each voltage level, preferably between 2 and 17. The output of the unit is measured and averaged over all levels, and the reference (average) value of the triangular wave is subtracted from the averaged output. If the resulting difference is beyond a threshold level, the offset is too high and the unit is declared non-functional. Otherwise the offset-value is stored, and the gain-difference is determined, using the determined offset-value. The gain-difference is preferably determined by injecting a signal, preferably an almost full triangular wave, for example ranging between 0x010 and 0x3F0, so that as much of the input range is covered, but so that the output values will not be truncated. The gain-difference, i.e. the ratio between the peak-to-peak value of the DAC-input signal and the peak-to-peak value of the ADC-output signal is determined, by means of calculating the sum of differences between the absolute DAC-input and the absolute ADC-output signal, over a full cycle of the above mentioned triangular waveform, to generate a gain-difference error. If the resulting gain-difference error exceeds a second threshold value, the unit is declared non-functional.

Then, when the offset-value and gain-difference are available and their values are acceptable, the unit can be tested on substantially all values. When testing the unit, the DAC-output is multiplied by the gain-difference, thus cancelling the gain-difference, and the offset-value is subtracted from each input value. Thus, the transfer functions of the DAC and ADC are matched by neutralizing the gain error and testing the actual output vs. the input.

Thus, using the offset-value and gain-difference during testing, provides the testing system with digital control over analog amplification, which enables the testing of the full range of values. Without such digital control, if the DAC amplification is to be increased or decreased by a factor, then digitization of the input multiplied by the gain factor will eliminate certain input values, resulting in incomplete testing. However, changing the gain enables the unit to be tested with all possible input values.

It will be appreciated by a person skilled in the art that although the disclosed methods and apparatus refer to a single channel, the same design can be applied to support two channels, a real channel and an imaginary channel.

Figure 1:
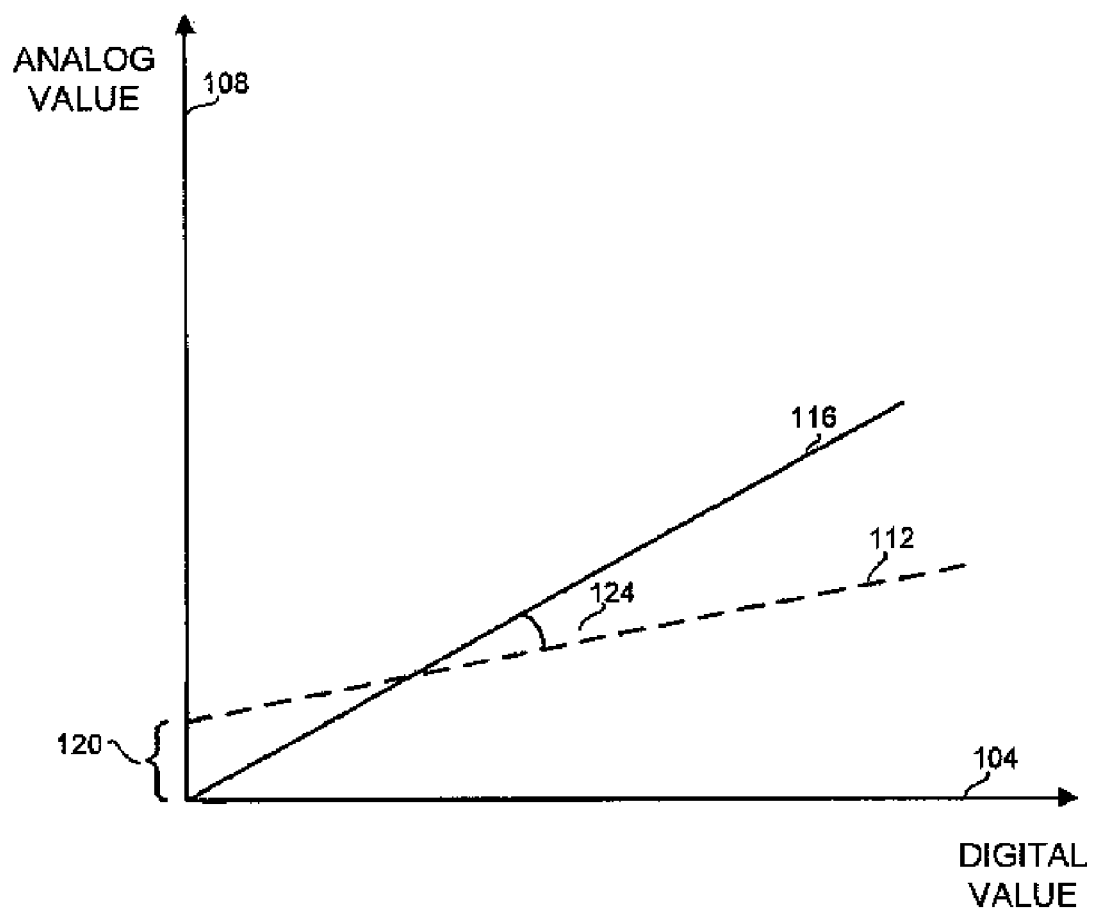
Figure 2:
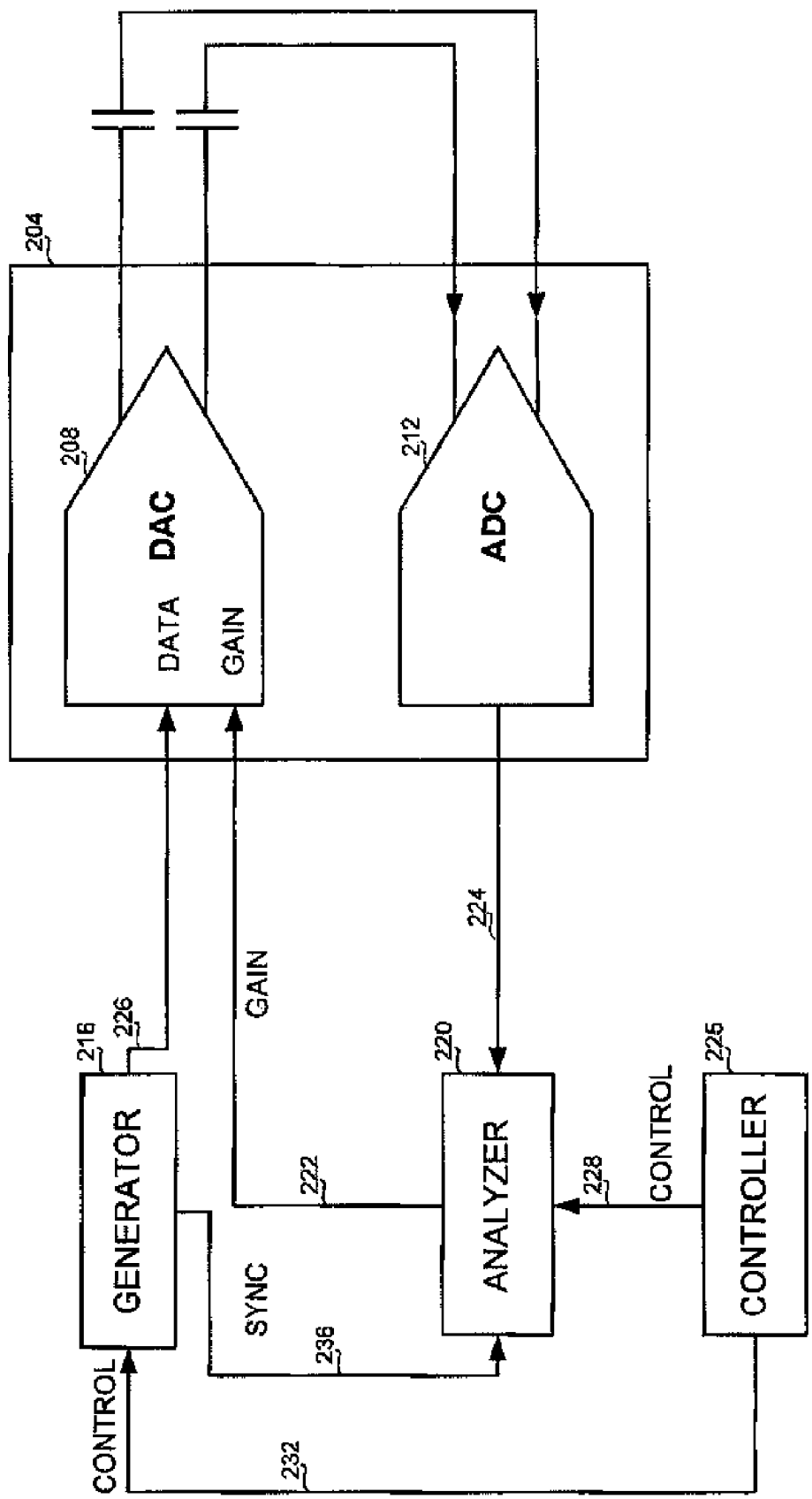
FIG. 2 is a schematic illustration of a testing apparatus, in a preferred embodiment to of the disclosure.

Referring now to FIG. 2, showing a schematic setting of a testing apparatus according to the disclosure. Unit 204 to be tested comprises DAC 208 and ADC 212.

Signal generator 216 injects input signals 226 into unit 204, both at calibration stage and at fill-testing stage. Analyzer 220 receives a synchronization signal 236 from generator 216, and output signal 224 of unit 204, and analyzes the results. Synchronization signal 236 is useful in matching the processing delay between the output stage and the input stage, so that the correct expected value is used.

During the calibration stage, a gain-difference value 222 is obtained, and then during the fill testing stage, the gain difference is used as gain-control and is injected into DAC 208, so that output 224 can be directly compared to input 226. The offset value is used by the analyzer during analysis of the resulting voltage. Analyzer 220 thus performs the following functions: analysis of the testing patters; determining the gain-difference and inputting the gain-control into the DAC; compensating the output signal using the offset value; controlling a test pattern generator to generate the proper test vectors; compensating for the pipeline delay between the DAC and ADC before comparing the values; supporting programmable tolerances for integrated nonlinearity and differential nonlinearity values; and indicating the test progress status. Controller 225 issues control commands 232 to test generator 216, and commands 228 to test analyzer 220 for issuing the correct control signals, and for controlling test level durations so as to allow for a sampling rate higher for the output signal than for the input signal, due to the processing time difference between DAC 208 and ADC 212.

It will be appreciated by a person skilled in the art that gain 222 can alternatively be injected to and used by ADC 212 instead of DAC 208.

Figure 3:
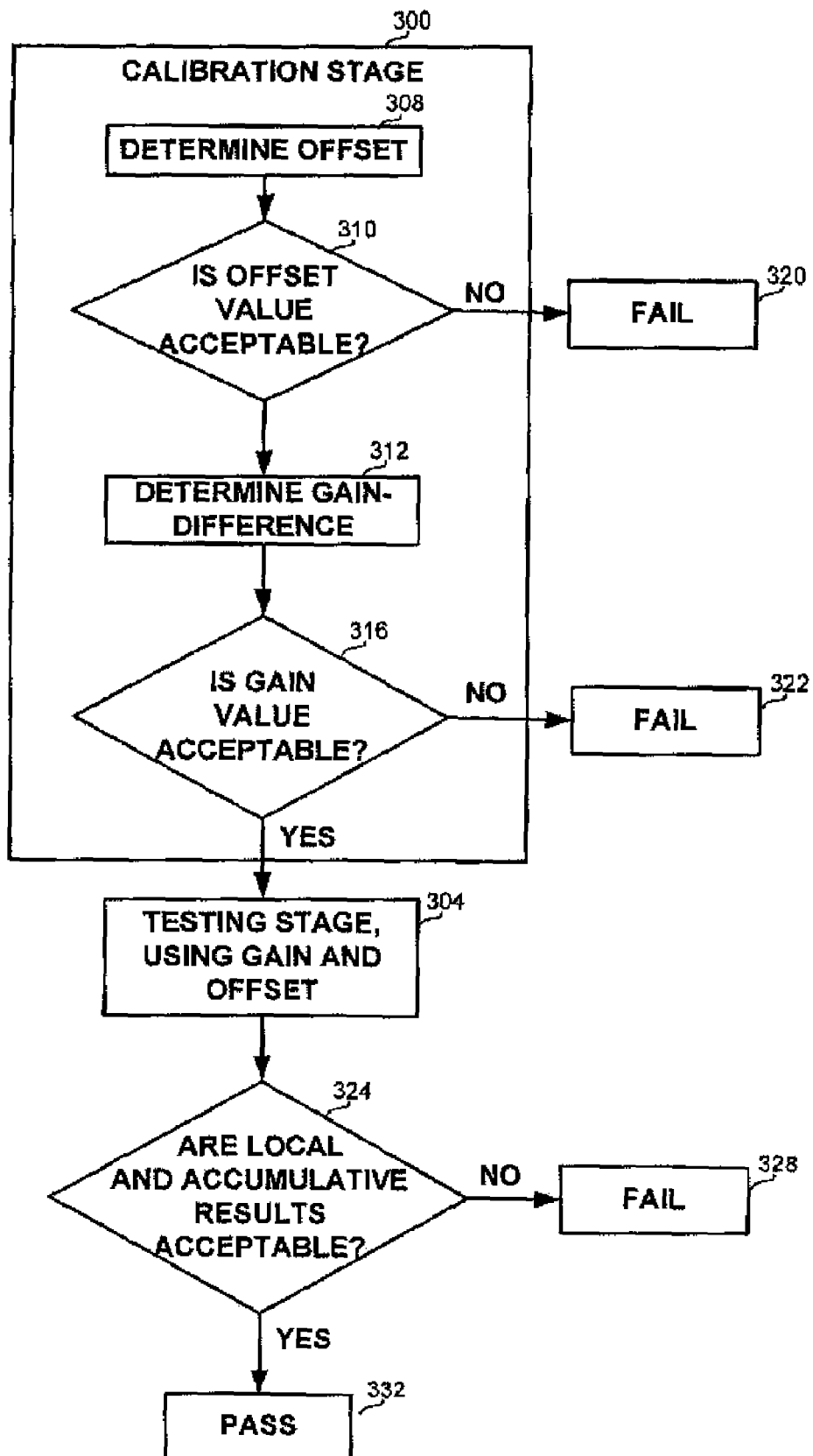
FIG. 3 is a schematic flowchart of the main steps in the method for testing a converter unit, in accordance with a preferred embodiment of the disclosure.

Referring now to FIG. 3, showing a flowchart of the main steps in testing a converter unit in accordance with the disclosure. The testing comprises two main stages, a calibration stage 300 and a testing stage 304, which uses the products of calibration stage 300, being the offset-value and the gain-difference. During the testing stage, the gain-control value is injected into the converter unit, and is used for changing the output of the DAC or the ADC.

Calibration stage 300 comprises offset-value determination step 308 for determining the offset between the DAC and the ADC, and gain-difference determination step 312 for determining the gain difference required to match between the DAC and the ADC. As detailed below, the offset-value is used during gain-determination, and temporary values of gain-difference are used for cancelling the gain-difference during later iterations of the gain-determination process.

Offset determination step 308 preferably comprises receiving a triangular wave, preferably having extreme values of 0x100 and 0x300 so that values exceeding these extremes will not be truncated, and M values altogether, wherein M is preferably 1024. The signal preferably has a duration of a predetermined number N, preferably ranging between 2 and 17) clock cycles for each voltage level, creating a frequency of 1/(2*N*T) wherein T is preferably but not limited to a 80 MHz reference clock cycle time (12.5 nsec). The ADC samples the received signal at the last cycle of each level for M cycles and the DC offset is determined according to the following formula:

$$Offset = \frac{1}{M} * \sum_{i=1}^{M} (ADC_{code[i]}) - \text{reference}$$

Wherein $ADC_{code[i]}$ is the output of the unit for input value i, and reference is the average value of the wave. This formula allows for averaging out the system noise from the DC offset value.

For offset calibration, the analyzer is fed with offset value of 0 and with reference value of 0. The accumulator is used to perform the integration function, while the offset value and the reference value are both set to 0x0. The division by M and the subtraction operations are done by the CPU software after accumulation is done. Once the offset value is determined, it is stored in an offset register.

Once offset determination step 308 is done, it is determined on step 310 whether the offset value exceeds a predetermined threshold, or is acceptable. If the value is not acceptable, the test is declared to fail on step 320. If the value is acceptable, gain determination step 312 is performed.

Gain determination step 312 and testing stage 304 are preferably performed by the same circuit, detailed in association with FIG. 6 below. During gain-difference determination step 312 a gain error is determined as detailed in association with FIG. 6 below. If the gain error exceeds a predetermined value, the unit is declared to fail on step 322.

If the offset and the gain-difference values are acceptable, on step 304 the unit will then be fully tested, wherein the test uses the determined offset and gain values. The offset-value is subtracted from the output of the ADC, and the gain-difference is used by setting the "unit size" of the DAC. In a preferred embodiment, the DAC generates output voltage which is proportional to the input. The ratio between the input and the output is controlled by the gain-control so as to compensate for the differences between the DAC gain and the ADC gain. The compensation assures that the DAC matches the ADC.

During the test, the difference between the input and output values is determined for each specific value, and the difference values are also integrated. If one or more specific value exceed a predetermined threshold-value, or the integrated value exceed another predetermined threshold-value, the unit is declared to fail on step 328, otherwise it is declared to pass on step 332.

Full test stage 304 can be implemented in a variety of ways. In one preferred embodiment, the testing is performed by a entering values generated by a pseudo random binary sequence (PRBS) generator, such as a linear feedback shift register, for example the register generated by the following formula: D[9:0]={[Q8:Q0],[Q9⊕Q6]}.

The PRBS is preferably initialized to 0x000. The PRBS generator scans 1023 codes of 10 bits value. The PRBS generator can be programmed to update its value every predetermined number of clock cycles. Since the DAC and the ADC may include some non-linear transformation functions, the ADC code may not match the DAC code. Therefore, a special logic is used to perform the following evaluation criteria:

Local_Error=|DAC_PRBS_Value−ADC_Sampled_Value|

Local_Error_criteria=Sample_Error>Threshold1

Integrated_Error_Criteria=(∫local_Error)>Threshold2

If local_area_criteria or integrated_error_criteria are true, the testing failed.

Yet another embodiment for full test stage 304 related to monotonic testing, on which the DAC is driven by a counter value that scans substantially all the values from 0x000 to 0x3FF and down to 0x000, using one LSB steps. Then the ADC output value is checked to track the injected signal and to assure monotonic transfer function, up to the allowed DNL limit.

The checking logic is preferably the same as detailed in association with the PRBS above.

It will be appreciated by a person skilled in the art that step 304 optionally comprises a step of sending a synchronization signal from the signal generator to the test analyzer for matching a processing delay between the output signal and the input signal, so that the correct expected value is used.

Figure 4:
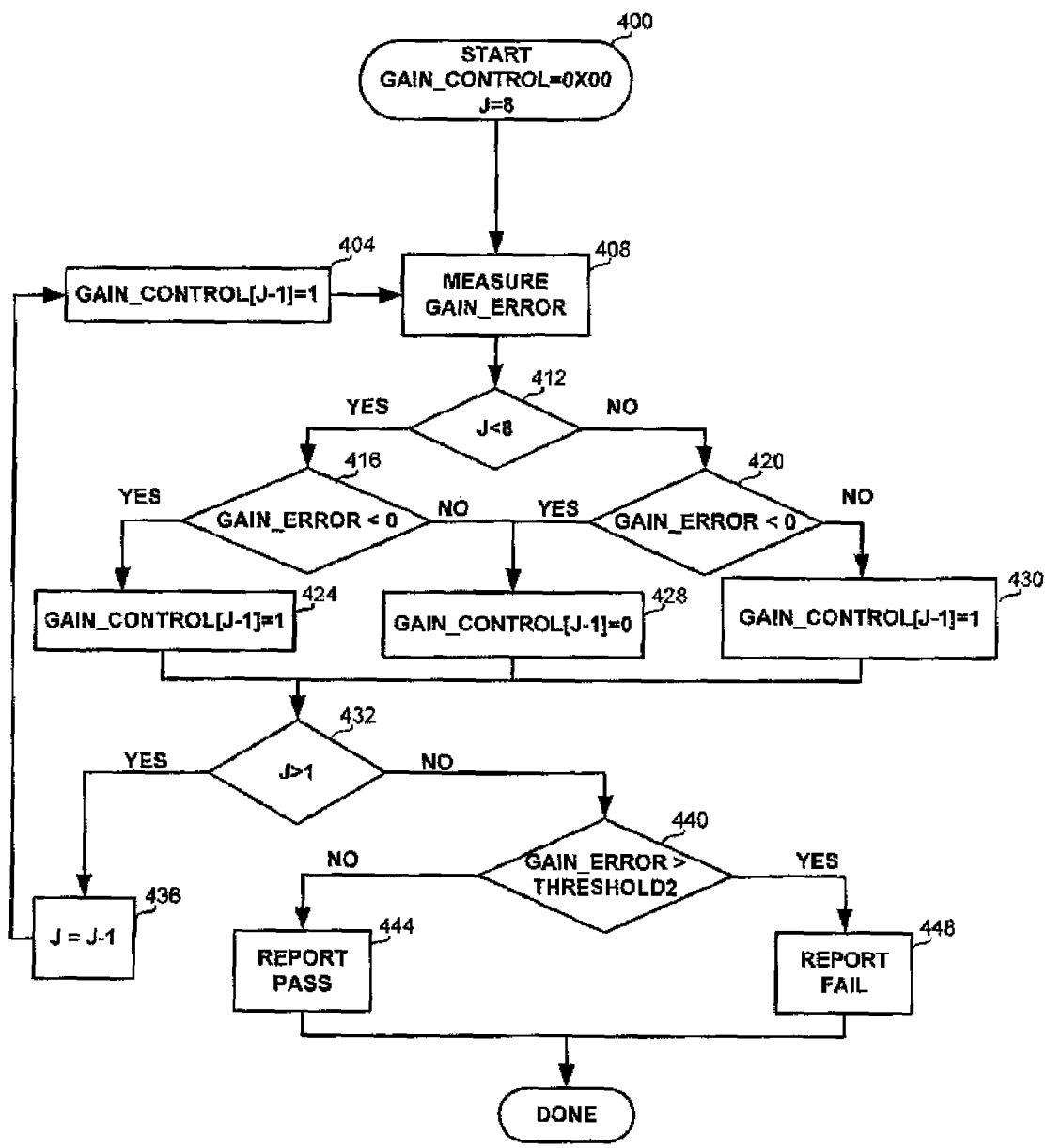
FIG. 4 is a schematic flowchart of the main steps in a method for gain calibration, in accordance with a preferred embodiment of the disclosure.

Referring now to FIG. 4, showing a flowchart of the main steps in a preferred implementation in a method for determining the gain difference, which is later used during fill testing as a gain control value. Generally, the gain control is stored in a signed 8 bit value referred to as gain_control, and is determined using the successive approximation algorithm, starting at the highest order, i.e. the most significant bit (MSB) and working towards the lowest order, i.e. the least significant bit (LSB). When determining each bit of the gain, the gain accumulated so far is applied to the unit and is used for scaling the voltage, which enables determining the next bit.

The input voltage is preferably a nearly full-swing triangle signal, for example ranging between 0x010 and 0x3F0, with duration of N clock cycles for each level, N preferably ranging between 2 and 17, thus creating a frequency of 1/(2*N*T) wherein T is preferably a 80 MHz reference clock cycle time. The ABC preferably samples the received signal at the last cycle of each level and the test controller sets the gain calibration value according to the detailed algorithm.

On step 400 the method starts by assigning a value of zero to the gain_control, and setting an integer variable J to 8. On step 408 the gain error is measured, with the gain accumulated so far. The gain error is preferably determined according to the following formula:

$$\text{Gain\_error} = \frac{1}{M} \sum_{1}^{M} (\text{ABS}(ADC - \textit{Offset}) - \text{ABS}(\text{reference}))$$

Wherein M is preferably 2048-P, P being a number of cycles, for example 16, ignored at each end of the signal to avoid saturation effects.

On step 412, if J is smaller than 8, then if the gain error measured on step 408 is determined on step 416 to be negative, i.e. the output signal of the unit is smaller than the reference signal, then on step 424 the j−1 bit of gain_control is set to one, otherwise on step 428 it is set to zero. If j=8, i.e. the MSB is handled, the reverse is done, since the gain_control is a signed number, and the initial value of zero implies mid-range value. Therefore, for j=8 if the gain-error is determined in step 420 to be negative, the MSB bit of gain_control is set on step 428 to be 0, otherwise it is set on step 430 to be 1. On step 432, if J is larger than one, i.e. the LSB is not the currently updated bit, J is decremented by one, the value accumulated in gain-control is used as a gain fed to the unit, and the process returns to step 404. On step 404 bit [J−1] of gain_control is set to 1, and the process repeats for the next iteration. If J is equal to one, then it is determined in step 440 whether the gain_error, as measured after all bits were set exceeds a threshold. If the gain error exceeds the threshold, the unit is reported to fail on step 448, otherwise it is reported to pass, and the accumulated gain_control is used as the gain control value in testing stage 304 of FIG. 3. It will be appreciated that the method for determining the gain is exemplary only, and other methods can be designed for this purpose.

Figure 5:
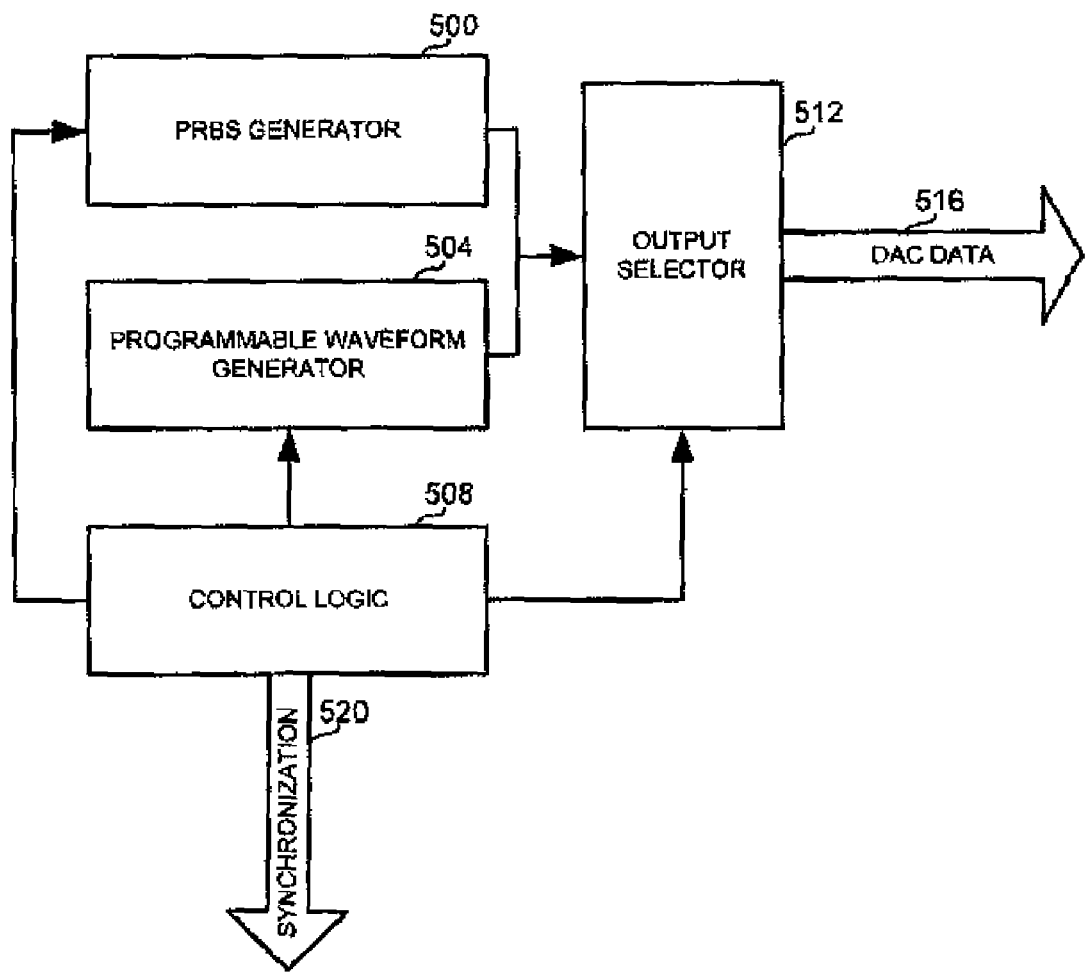
FIG. 5 is a schematic illustration of the signal generator, in accordance with a preferred embodiment of the disclosure.

Referring now to FIG. 5, showing a schematic block diagram of the main components in a preferred implementation of signal generator 216 of FIG. 2. Signal generator 216 comprises a Pseudo random binary sequence generator 500, for generating to signals of pseudo-randomly varying levels in order to test unit 204 under as realistic conditions as possible. Signal generator 216 further comprises programmable waveform generator 504 for generating any required wave, such as triangular waves having predetermined minimal and maximal values, and output selector 512 for selecting between the pseudo random signal and the wave signal and outputting data 516 to DAC is 208 of FIG. 2. The selection uses the output of control logic unit 508, which sends synchronization signals 520 to analyzer 220 of FIG. 2.

Figure 6:
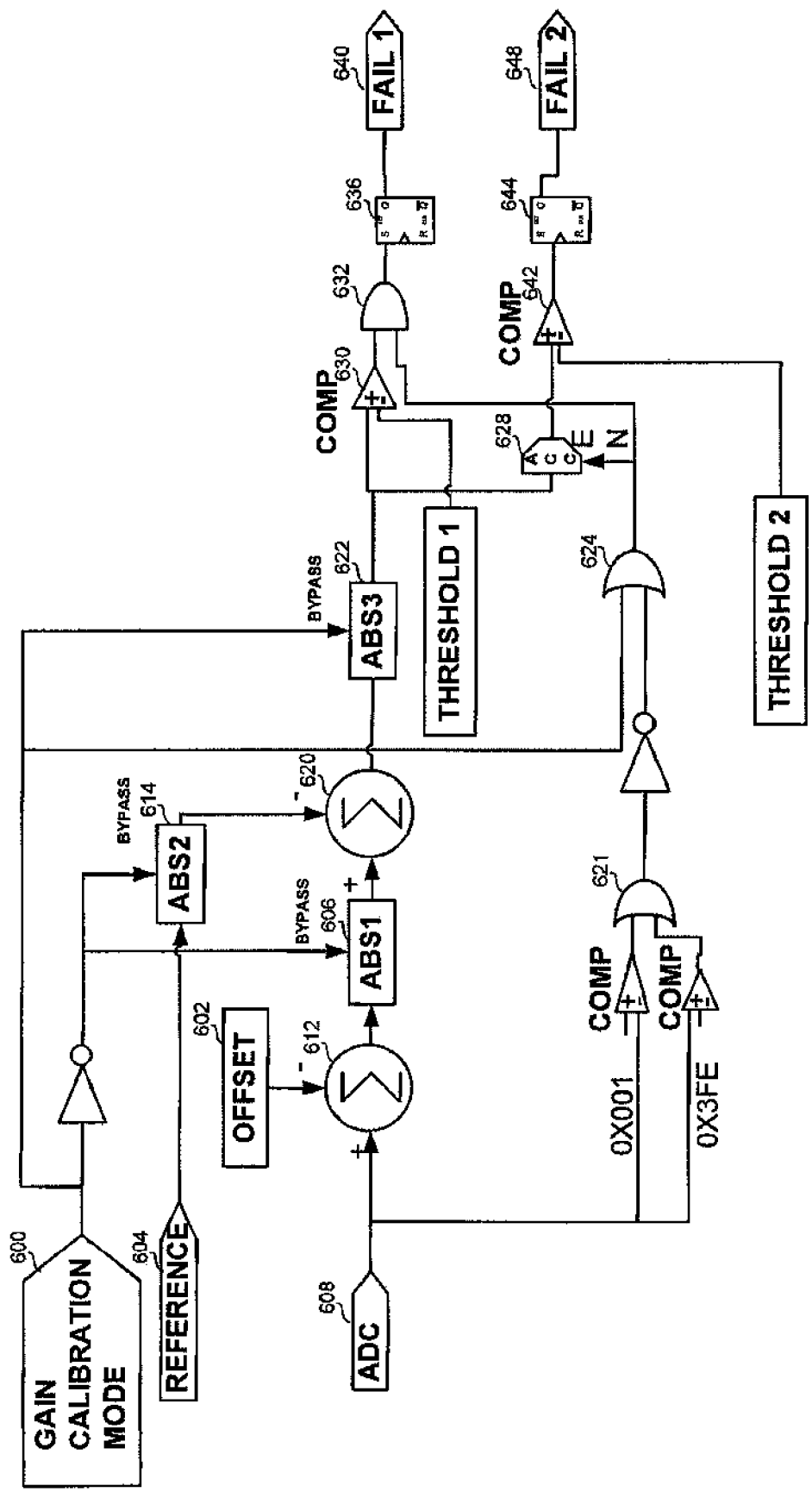
FIG. 6 is a schematic illustration of the signal test analyzer circuit, in accordance with a preferred embodiment of the disclosure.

Referring now to FIG. 6, showing a schematic diagram of the signal test analyzer circuit, which determines the gain and tests the converters unit.

The circuit uses two threshold values for the maximal allowed error, wherein the first threshold is used in association with a specific sample maximal deviation, and the second threshold is used in association with a maximal deviation integrated over multiple values. The first threshold is preferably stored in a 16 bits read/write register, and the second threshold is preferably implemented as a 32 bit read/write register.

The accumulator is available for the CPU as a read-only 24 bits register. The accumulator is cleared to 0x0 at the start of each stage.

The circuit receives gain calibration mode 600, which is equal to one during gain-difference determination and calibration stage and zero during the testing stage; offset value 602 determined earlier; reference value 604, and ADC output 608.

For gain calibration measurements, ABS1 606 and ABS2 614 modules are enabled while ABS3 622 is bypassed. For the full testing, ARS1 606 and ABS2 614 are bypassed while ABS3 622 is enabled.

Logic gate 621 and logic gate 624 limit the value range during the full testing stage, but not during the calibration stage, to values less extreme than the full span of the signal, preferably between 0x001 and 0x3FE, so as to avoid the non linear effect of saturated input signal Thus, During full testing stage, comparator 630 compares for each input value, the value of ABS(ADC-offset-reference) vs. Threshold1, and if the value exceeds Threshold1, a FAIL1 flag 640 is set and stored by flip-flop 636. Comparator 642 compares the values accumulated by accumulator 628 over the full period to threshold, and if the accumulated value exceeds thresholds, a FAIL2 flag 648 is set and stored by flip-flop 644.

During calibration stages, Fail1 flag 640 and Fail2 flag 648 are generally not used. The disclosed methods and testing environment enable the determination of offset and gain-difference values between a DAC and ADC. The values are determined and then used when testing the output value of a pair of converters, so as to avoid testing them separately, thus saving on excessive equipment and time. Injecting the gain into any of the converters enable digital control over the analog amplification, which enables testing the full range of input values.

The methods and testing environment are preferably used as a built-in self test that can accelerate the testing time and reduce costs, assure robust and repeatable test coverage. When a system is composed from only one DAC which has gain calibration option and more than one ADC channels, the different ADC channels may have different analog gain, thus the system can not test multiple ADC channels at the same time.

Therefore the testing sequence is preferably performed sequentially. On the first stage the DACs will be used to validate the ADC of the first ADC channel, and once completed, the test will be repeated with the ADCs of the next ADC channel and so on until all the channels are tested.

It will be appreciated that in order to match the differences in processing time between the DAC and the ADC, wherein the DAC is generally faster, either the value injected into the DAC is maintained by generator 216 of FIG. 2 according to control signals sent from the controller to the signal generator, so that the value can then be compared against the output, or analyzer 220 is equipped with a mechanism for storing the value input into the DAC until the relevant output value can be measured.

It will be appreciated by a person skilled in the art that the coupling capacitors connecting the DAC output to the ADC input require charging to allow for accurate measurement to take place. However, as described below, for charging the coupling capacitors, the DAC will have to feed a pattern that will be used only for setup capacitors charging. As the feedback from the DAC to the ADC is performed in AC coupled circuit, the BIST logic will perform the pattern injection for a full cycle before the actual sampling starts. As an example, during the offset calibration, the generator will first inject full cycle of the test pattern, and only on the following cycle the measurement will be performed. During the coupling capacitors charging phase, all the calibration and measurements status registers (including the error detections and the accumulators) are frozen in reset state. The coupling capacitors charging may be skipped according to special configuration bit.

It will also be appreciated by a person skilled in the art that multiple variations and options can be designed along the guidelines of the disclosed method and apparatus. Such variations are covered by the disclosure.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation, material, step of component to the teachings without departing from the essential scope thereof. Therefore, it is intended that the disclosed subject matter not be limited to the particular embodiment disclosed as the best mode contemplated for carrying out this invention, but only by the claims that follow.

The invention claimed is:

1. A method for testing a unit comprising a first converter converting from digital to analog signals and a second converter converting from analog to digital signals, the method comprising:
   a calibration stage, the calibration stage comprising:
      an offset determination step for determining an offset between the first converter and the second converter; and
      a gain-difference determination step for determining a gain-control value differentiating between the first converter and the second converter; and
   a testing stage for testing the unit,
   wherein during the testing stage, the gain-control value is injected into the unit, and is used for changing the output of one of the first converter or the second converter, and wherein the offset is subtracted from the output of the second converter.

2. The method of claim 1 wherein during the testing stage, a difference between a specific input value injected into the unit and an output value of the unit is compared against a first threshold.

3. The method of claim 1 wherein during the testing stage, an integrated difference between an input signal injected into the unit and a signal output by the unit is compared against a second threshold.

4. The method of claim 1 wherein the gain-difference determination step uses successive approximation.

5. The method of claim 4 wherein the gain-difference value determined at each iteration of the successive approximation is used during later iterations.

6. The method of claim 4 wherein the successive approximation determines a higher order bit of the gain value prior to determining a lower order bit.

7. The method of claim 1 further comprising a step of sending a synchronization signal so as to adjust sampling an input signal injected into the unit with sampling an output signal output by the unit.

8. A testing apparatus for testing a unit having a unit amplification, the testing apparatus comprising a first converter converting from digital to analog signals and a second converter converting from analog to digital signals, the testing apparatus comprising:

- a signal generator for generating input signal to be injected into the unit;
- a test analyzer for comparing the input signal to an output signal output from the unit and determining an offset value and a gain-control value between the first converter and the second converter; and
- a test controller for controlling an offset value and test value determination stage and full testing stage, wherein after the offset value and the gain-control value are determined, the gain-control value is input into the unit, so as to enable digital control of the unit amplification.

9. The apparatus of claim 8 wherein a synchronization signal is sent from the signal generator to the test analyzer for matching a processing delay between the output signal and the input signal.

10. The apparatus of claim 8 wherein the controller controls test level durations so as to allow for a sampling rate higher for the output signal than for the input signal.

* * * * *